US008235097B2

(12) United States Patent
Scordino et al.

(10) Patent No.: US 8,235,097 B2
(45) Date of Patent: Aug. 7, 2012

(54) COOLING APPARATUS

(75) Inventors: Alessandro Scordino, Mestre (IT); Alessandro Brieda, Sacile (IT); Giovanni Scilla, Fontane di Villorba (IT)

(73) Assignee: Osram AG, Munich (DE)

( * ) Notice: Subject to any disclaimer, the term of this patent is extended or adjusted under 35 U.S.C. 154(b) by 1051 days.

(21) Appl. No.: 12/129,150

(22) Filed: May 29, 2008

(65) Prior Publication Data

US 2009/0084531 A1 Apr. 2, 2009

(30) Foreign Application Priority Data

May 30, 2007 (EP) .................................... 07010690

(51) Int. Cl.
*F28F 13/12* (2006.01)
*H05K 7/20* (2006.01)

(52) U.S. Cl. ...................................... 165/122; 165/80.3

(58) Field of Classification Search ................. 165/80.3, 165/104.34, 121, 122, 124, 125; 361/679.49, 361/679.5, 695, 697; 362/372
See application file for complete search history.

(56) References Cited

U.S. PATENT DOCUMENTS

| | | | | |
|---|---|---|---|---|
| 6,183,196 | B1 * | 2/2001 | Fujinaka | 415/208.5 |
| 6,631,756 | B1 * | 10/2003 | Hegde | 165/80.3 |
| 6,778,390 | B2 * | 8/2004 | Michael | 361/695 |
| 6,781,834 | B2 * | 8/2004 | Nair et al. | 361/697 |
| 6,948,555 | B1 * | 9/2005 | Garcia | 165/80.3 |
| 7,584,780 | B1 * | 9/2009 | Lemont et al. | 165/80.3 |
| 7,787,247 | B2 * | 8/2010 | Han | 361/679.47 |
| 7,959,330 | B2 * | 6/2011 | Hashimoto et al. | 362/373 |
| 2002/0100577 | A1 * | 8/2002 | Wagner | 165/80.3 |
| 2004/0222516 | A1 | 11/2004 | Lin et al. | 257/712 |
| 2005/0145366 | A1 * | 7/2005 | Erel | 165/80.3 |
| 2005/0174780 | A1 | 8/2005 | Park | 362/294 |
| 2006/0092610 | A1 * | 5/2006 | Hegde | 361/697 |
| 2006/0193139 | A1 * | 8/2006 | Sun et al. | 362/373 |

OTHER PUBLICATIONS

European Search Report; EP 07 01 0690; pp. 6, Oct. 29, 2007.

* cited by examiner

*Primary Examiner* — Tho V Duong

(57) ABSTRACT

A cooling apparatus has a heat sink thermally connectable to a heat source an air outlet opening at least two air intake openings, and a fan adapted to draw in air into the cooling apparatus through the air intake openings and to discharge the air from the cooling apparatus through the air outlet opening, wherein, upon operation of said fan, an air flow from at least one of the air intake openings forces an air flow from at least another one of the air intake openings to the heat sink.

18 Claims, 2 Drawing Sheets

COOLING APPARATUS

CROSS-REFERENCE TO RELATED APPLICATIONS

This application claims priority to European Patent Application Number 07010690.1 filed on May 30, 2007. The contents of this application is incorporated herein in its entirety by this reference.

TECHNICAL FIELD

The invention relates to a cooling apparatus and a method for cooling a heat source, in particular for cooling a lighting element like a light emitting diode (LED) device, especially a high power LED array.

BACKGROUND

Common high power LED arrays are coupled to heat sinks that dissipate heat coming from the LED array by means of convection cooling. However, to maintain a sufficient cooling performance for high power LED arrays, the heat sink must be exhibit a large cooling area making the lighting device bulky and costly.

SUMMARY

A more compact and cost effective cooling method for lighting devices can be provided according to an embodiment, by a cooling apparatus, comprising a heat sink thermally connectable to a heat source, an air outlet opening, at least two air intake openings, and a fan adapted to draw in air into the cooling apparatus through the air intake openings and to discharge the air from the cooling apparatus through the air outlet opening, wherein, upon operation of said fan, an air flow from at least one of the air intake openings forces an air flow from at least another one of the air intake openings to the heat sink.

According to another embodiment, a method for cooling a heat source connected to a heat sink, may comprise the steps of: drawing in air into a housing from at least two air intake openings such that an air flow from at least one of the air intake openings forces an air flow from at least another one of the air intake openings to the heat sink, and subsequently discharging the air out of the housing.

According to a further embodiment, the cooling apparatus can be adapted to create laminar air flows. According to a further embodiment, air intake openings of interacting air flows can be arranged substantially facing each other. According to a further embodiment, at least one of the air intake openings may comprise a filter grid. According to a further embodiment, the heat sink may comprise a heat conduction structure substantially facing the fan wherein at least one of the air flows is forced to the heat conduction structure. According to a further embodiment, the heat conduction structure may comprise at least one out of heatsink pin, a cooling fin, and a cooling plate. According to a further embodiment, the heat source may be arranged opposite to the heat conduction structure. According to a further embodiment, the cooling apparatus may comprise a substantially tubular housing within which the fan and the heat sink are arranged spaced apart to form an air flow region between them, the air flow region comprising a radially extending part that includes the air intake openings wherein air intake openings with interacting air flows face each other in a longitudinal direction. According to a further embodiment, the heat source may comprise at least one of a light emitting diode and a laser diode.

BRIEF DESCRIPTION OF THE DRAWINGS

The following figures schematically show a non-restricting embodiment.

DETAILED DESCRIPTION

Figure 1:
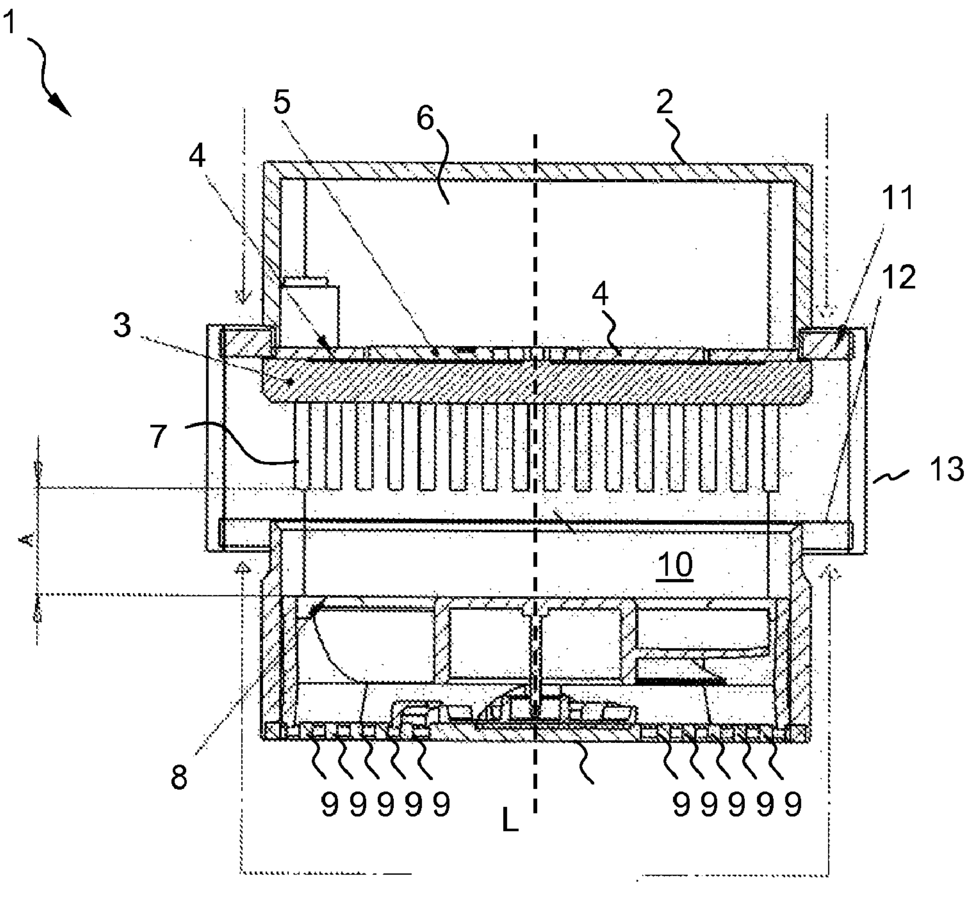
FIG. 1 shows a cross sectional view of a cooling apparatus.

The cooling apparatus may comprise a heat sink that can be thermally connected to a heat source, and further an air outlet opening and at least two air intake openings. The cooling apparatus also may comprise a fan adapted to draw in air into the cooling apparatus through the air intake openings and to discharge the air from the cooling apparatus through the air outlet opening. The cooling apparatus can be arranged such that, when the fan is operated, an air flow from at least one of the air intake openings forces an air flow of relatively cool ambient air from at least another one of the air intake openings to the heat sink, thus cooling it down.

This directing of cool air over (or through) the heat sink provides a high cooling efficiency without the need for complicated and space consuming air deflectors. Since also the heat sink can be designed with relatively small dimensions, a compact form and cost effective assembly can be achieved. The apparatus is reliable and safe to operate.

The heat source may comprise, but is not restricted to, a lighting device, advantageously high power LEDs or laser diodes, in particular an array of high power LEDs or laser diodes.

Advantageously, if using a LED (or laser diode) array, the single LEDs can be located at the heat sink in an even pattern, e.g., being equidistant to each other, to obtain a relatively uniform heat dissipation into the heat sink.

To obtain a sufficient interaction between certain air flows, respective air intake openings can be advantageously arranged substantially facing each other. Thus, the interacting air flows can be guided towards each other, and by their mutual interaction one of the air flows can push the other one to the heat sink.

To improve lifetime and to limit acoustic noise, the cooling apparatus may be advantageously adapted to create laminar air flows.

To avoid high pressure drops or a relevant speed reduction and to avoid turbulent air flows, at least one of the air intake openings, preferably all of the air intake openings, may comprise a filter grid. The filter grid may also provide protection of the cooling apparatus from electric shock and external agents such that the fields of operation can be expanded. The filter grid can be advantageously provided with defined apertures.

Advantageously, the heat sink may comprise a heat conduction structure substantially facing the fan wherein at least one of the air flows is forced to the heat conduction structure. Thus, this air flow flows over and through the heat conduction structure to create an even more effective heat dissipation. Advantageously, heat conduction structure may comprise at least one out of heatsink pin, a cooling fin, and a cooling plate.

Advantageously, the heat sink can be made of more than 95% pure aluminium, preferably at least 99% pure aluminium, and can be advantageously made by high pressure molding, especially at a pressure above 800 bar, to improve thermal conductivity. The effective cooling enables a high brightness thanks to an increased thermal efficiency.

To separate the heat source, especially the LEDs, from the cooling region, the reception means can be arranged opposite to the heat conduction structure. Thus can be provided a light conduction direction opposite to the warm air extraction in order to get a relatively cold light source.

Advantageously, the cooling apparatus may comprise a substantially tubular housing within which the fan and the heat sink are arranged spaced apart to each other to form an air flow region between them. The air flow region may comprise a radially extending part that includes the air intake openings wherein air intake openings with interacting air flows face each other in a longitudinal direction. The radially extending part may be an annular radial extension.

Further, a method for cooling a heat source connected to a heat sink, e.g., a LED array, may be provided wherein a fan draws in air into a housing from at least two air intake openings such that an air flow from at least one of the air intake openings forces an air flow from at least another one of the air intake openings to the heat sink, thus cooling it, and wherein the fan subsequently discharges the air out of the housing. Advantageously, the air flows can be substantially laminar.

FIG. 1 shows an active cooling apparatus 1. The cooling apparatus 1 comprises a housing 2 of a basically tubular shape with a longitudinal axis L. Within the housing 2 is mounted a metal heat sink 3. The heat sink 3 is thermally connected to a high power LED array 4 by means of a thermally conducting adhesive 5. The heat sink 3 and the upper part of the housing 2 including the upper (top) wall define an upper LED array reception space 6. At the lower side of the heat sink 3—opposite to the LED side—is provided a heat conduction structure in form of a bed of heat conduction/dissipation pins 7.

The heat sink 3, including the heat conduction/dissipation pins 7, is made of at least 99% pure aluminium and is manufactured by high pressure molding at a pressure above 800 bar to improve thermal conductivity.

On the lower (bottom) side wall of the housing sits a fan 8 that occupies the full cross-section of the housing 2 at that section. The fan 8 is designed to draw in air from the interior of the housing 2 and expel it through an an air outlet opening at the bottom wall formed of several through holes 9. The fan 8 and the heat sink 3 (measured from the pins 7) are spaced apart a distance A. Fan 8, heat sink 3, and sections of the side wall of the housing 2 define a cooling space 10.

The housing 2 further comprises an upper air intake opening 11 and a lower air intake opening 12. In particular, the openings 12, 13 are provided in a radial extension 13 of the side wall of the housing 2. The openings 11, 12 are located facing each other in the longitudinal direction, as shown. The fan 8 is adapted to draw in (suck) air into the housing 2 through the air intake openings 11, 12. An air flow from the lower air intake opening 12 forces/pushes an air flow from the upper air intake opening 11 to the heat sink 3, namely through the cushion of pins 7, as will be described in more detail in FIG. 2.

The upper air intake opening 11 comprises a filter grid (without reference number) comprising defined apertures. By designing and arranging the components of the cooling apparatus 1, e.g., the size and number of the apertures of the filter grid; the location of the intake openings 11, 12; the form of air channels between the openings 11, 12 and the heat sink 3, 7 used to accelerate and redirect the air flow; the distance A; the fan power etc.; the cooling apparatus creates laminar air flows within the cooling space 10.

Figure 2:
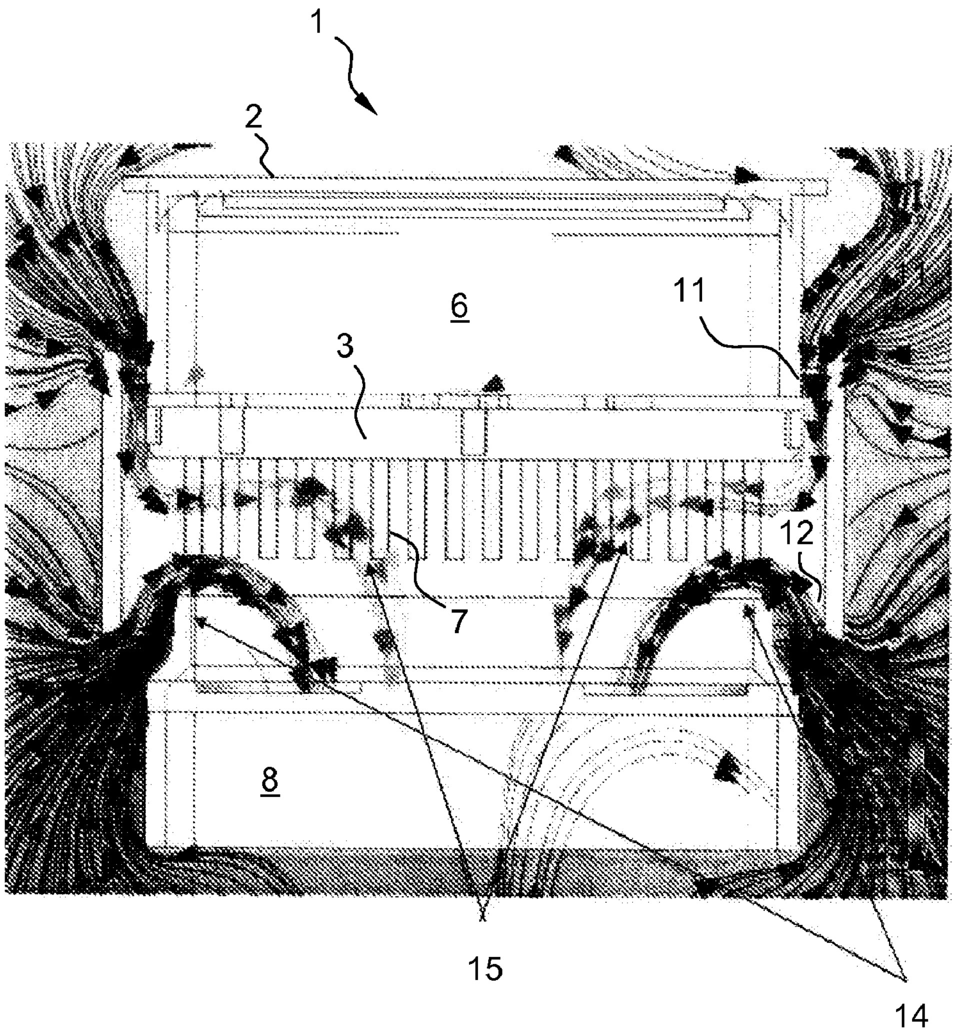
FIG. 2 shows the cooling apparatus of FIG. 1 with plotted air flows profiles.

FIG. 2 shows the air flow profile 14 from the lower air intake opening (or channel) 12 to the fan 8 and the air flow profile 15 from the upper air intake opening (or channel) 11 to the fan 8. The lower air flow profile 14—due to the operation of the fan 8 (suction), the high air flow velocity, and the curvature of its profile—are interacting such that the lower air flow profile 14 pushes the upper air flow profile 15 through the pins 7 of the heat sink 3, thus improving the thermal management efficiency of the system. The air flow profiles 14, 15 show that the air is flowing substantially laminar which results in a uniform air flow speed over the fan vane and a uniform temperature of the fan gear such that the lifetime of the fan is preserved.

LIST OF REFERENCE NUMBERS

1 cooling apparatus
2 housing
3 heat sink
4 high power LED array
5 thermally conducting adhesive
6 LED array reception space
7 heat conduction pins
8 fan
9 through holes
10 cooling space
11 upper air intake opening
12 lower air intake opening
13 radial extension
14 lower air flow profile
15 upper air flow profile

What is claimed is:

1. A cooling apparatus, comprising:

a heat sink thermally connectable to a heat source, an air outlet opening, at least two air intake openings, and a fan adapted to draw in air into the cooling apparatus through the air intake openings and to discharge the air from the cooling apparatus through the air outlet opening, wherein, upon operation of said fan, an air flow from at least one of the air intake openings forces an air flow from at least another one of the air intake openings to the heat sink, the cooling apparatus further comprising a substantially tubular housing within which the fan and the heat sink are arranged spaced apart to form an air flow region between them, the air flow region comprising a radially extending part that includes the air intake openings, wherein air intake openings with interacting air flows face each other in a longitudinal direction.

2. The cooling apparatus according to claim 1, being adapted to create laminar air flows such that a laminar air flow from at least one of the air intake opening forces a laminar air flow from at least another one of the air intake openings to the heat sink.

3. The cooling apparatus according to claim 1, wherein air intake openings of interacting air flows are arranged substantially facing each other.

4. The cooling apparatus according to claim 1, wherein at least one of the air intake openings comprises a filter grid.

5. The cooling apparatus according to claim 1, wherein the heat sink comprises a heat conduction structure substantially facing the fan wherein at least one of the air flows is forced to the heat conduction structure.

6. The cooling apparatus according to claim 5, wherein the heat conduction structure comprises at least one out of heat-sink pin, a cooling fin, and a cooling plate.

7. The cooling apparatus according to claim 1, wherein the heat source is to be arranged opposite to the heat conduction structure.

8. The cooling apparatus according to claim 1, wherein the heat source comprises at least one of a light emitting diode and a laser diode.

9. A method for cooling a heat source connected to a heat sink, comprising the steps of:

drawing in air into a housing from at least two air intake openings such that an air flow from at least one of the air intake openings forces an air flow from at least another one of the air intake openings to the heat sink, and subsequently discharging the air out of the housing, further comprising the steps of arranging a fan and the heat sink within a substantially tubular housing spaced apart to form an air flow region between them, wherein the air flow region comprises a radially extending part that includes the air intake openings, and wherein air intake openings with interacting air flows face each other in a longitudinal direction.

10. The method according to claim 9, wherein the air flows are substantially laminar air flows such that a laminar air flow from at least one of the air intake opening forces a laminar air flow from at least another one of the air intake openings to the heat sink.

11. The method according to claim 9, wherein air intake openings of interacting air flows are arranged substantially facing each other.

12. The method according to claim 9, wherein at least one of the air intake openings comprises a filter grid.

13. The method according to claim 9, wherein the heat sink comprises a heat conduction structure substantially facing the fan wherein the method further comprises the step of forcing at least one of the air flows to the heat conduction structure.

14. The method according to claim 13, wherein the heat conduction structure comprises at least one out of heatsink pin, a cooling fin, and a cooling plate.

15. The method according to claim 9, wherein the heat source is to be arranged opposite to the heat conduction structure.

16. The method according to claim 9, wherein the heat source comprises at least one of a light emitting diode and a laser diode.

17. A method for cooling an apparatus, comprising the steps of:

providing a heat sink thermally connectable to a heat source, providing an air outlet opening, providing at least two air intake openings, and providing a fan adapted to draw in air into the cooling apparatus through the air intake openings and to discharge the air from the cooling apparatus through the air outlet opening, wherein, upon operation of said fan, an air flow from at least one of the air intake openings forces an air flow from at least another one of the air intake openings to the heat sink, further comprising the steps of arranging the fan and the heat sink within a substantially tubular housing spaced apart to form an air flow region between them, wherein the air flow region comprises a radially extending part that includes the air intake openings, and wherein air intake openings with interacting air flows face each other in a longitudinal direction.

18. The method according to claim 17, wherein the air flows are substantially laminar air flows such that a laminar air flow from at least one of the air intake opening forces a laminar air flow from at least another one of the air intake openings to the heat sink.

* * * * *